United States Patent
Huang et al.

(10) Patent No.: US 10,587,253 B1
(45) Date of Patent: Mar. 10, 2020

(54) RING OSCILLATOR-BASED PROGRAMMABLE DELAY LINE

(71) Applicant: QUALCOMM Incorporated, San Diego, CA (US)

(72) Inventors: Yu Huang, San Diego, CA (US); Nam Dang, San Diego, CA (US); Keith Alan Bowman, Morrisville, NC (US); Navid Toosizadeh, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/205,093

(22) Filed: Nov. 29, 2018

(51) Int. Cl.
| | | |
|---|---|---|
| *G06F 1/04* | (2006.01) | |
| *H03K 5/1534* | (2006.01) | |
| *H03K 5/135* | (2006.01) | |
| *H03K 3/03* | (2006.01) | |
| *H03K 21/38* | (2006.01) | |

(Continued)

(52) U.S. Cl.
CPC ......... *H03K 5/1534* (2013.01); *H03K 3/0315* (2013.01); *H03K 19/20* (2013.01); *H03K 21/38* (2013.01); *H03K 2005/0015* (2013.01); *H03K 2005/00019* (2013.01); *H03K 2005/00247* (2013.01)

(58) Field of Classification Search
CPC combination set(s) only.
See application file for complete search history.

(56) References Cited

U.S. PATENT DOCUMENTS

| | | |
|---|---|---|
| 5,451,894 A | 9/1995 | Guo |
| 5,465,076 A | 11/1995 | Yamauchi et al. |

(Continued)

FOREIGN PATENT DOCUMENTS

| | | |
|---|---|---|
| EP | 1223493 A1 | 7/2002 |
| JP | H02184908 A | 7/1990 |

(Continued)

OTHER PUBLICATIONS

Bowman K.A., et al., "A 16 nm All-Digital Auto-Calibrating Adaptive Clock Distribution for Supply Voltage Droop Tolerance Across a Wide Operating Range", IEEE Journal of Solid-State Circuits, Jan. 2016, vol. 51, No. 1, pp. 8-17.

(Continued)

*Primary Examiner* — An T Luu
(74) *Attorney, Agent, or Firm* — Loza & Loza LLP/Qualcomm

(57) ABSTRACT

A programmable delay line includes a pulse generator configured to generate a pulse in response to a transition of an input signal; an oscillator configured to generate a clock in response to the pulse; a counter configured to change a current count from a first value towards a second value in response to periods of the clock; and a gating device configured to output the transition of the input signal to generate an output signal in response to the current count reaching the second value. The delay of the input signal is a function of the difference between the first value and the second value. The delay line may be used in different applications, such as a dynamic variation monitor (DVM) configured to detect supply voltage droop. The DVM may be in an adaptive clock distribution (ACD) to reduce the clock frequency for a datapath in response to a droop.

26 Claims, 6 Drawing Sheets

(51) Int. Cl.
  *H03K 19/20*   (2006.01)
  *H03K 5/00*   (2006.01)

(56) References Cited

U.S. PATENT DOCUMENTS

| | | | |
|---|---|---|---|
| 5,519,344 | A | 5/1996 | Proebsting |
| 5,900,762 | A | 5/1999 | Ramakrishnan |
| 6,046,606 | A | 4/2000 | Chu et al. |
| 6,307,412 | B1 | 10/2001 | Kim et al. |
| 6,944,780 | B1 | 9/2005 | Kranzen et al. |
| 7,036,029 | B2 | 4/2006 | May et al. |
| 7,129,763 | B1 | 10/2006 | Bennett et al. |
| 7,167,035 | B2 | 1/2007 | Cao |
| 7,417,482 | B2 * | 8/2008 | Elgebaly ............... G06F 1/3203 327/278 |
| 7,728,642 | B1 | 6/2010 | O'Dwyer |
| 8,067,959 | B2 | 11/2011 | Plants et al. |
| 9,024,670 | B2 | 5/2015 | Tiwari et al. |
| 9,413,344 | B2 | 8/2016 | Bowman et al. |
| 9,543,044 | B2 * | 1/2017 | Jain ........................ G11C 29/48 |
| 2002/0190283 | A1 | 12/2002 | Seno et al. |
| 2004/0159896 | A1 | 8/2004 | Honda |
| 2004/0239395 | A1 | 12/2004 | Nakai |

FOREIGN PATENT DOCUMENTS

| | | |
|---|---|---|
| JP | 4119008 A | 4/1992 |
| JP | 6303096 A | 10/1994 |
| JP | 8181596 A | 7/1996 |
| JP | 9214306 A | 8/1997 |
| JP | 11261406 A | 9/1999 |
| JP | 2000013206 A | 1/2000 |
| JP | 2002100967 A | 4/2002 |
| JP | 2004253880 A | 9/2004 |
| JP | 2006004338 A | 1/2006 |

OTHER PUBLICATIONS

Akui S., et al., "Dynamic Voltage and Frequency Management for a Low-Power Embedded Microprocessor", IEEE International Solid-State Circuits Conference, 2004, 10 pages.

Burd T.D., et al., "A Dynamic Voltage Scaled Microprocessor System", IEEE Journal of Solid-State Circuits, Nov. 2000, vol. 35, No. 11, pp. 1571-1580.

Dhar S., et al., "Closed-Loop Adaptive Voltage Scaling Controller for Standard-Cell ASICs," ISLPED '02, Aug. 12-14, 2002, 5 pages.

Elgebaly M., et al., "Efficient Adaptive Voltage Scaling System Through On-Chip Critical Path Emulation," ISLPED 04, Aug. 9-11, 2004, pp. 375-380.

Kuroda T., et al., "Variable Supply-Voltage Scheme for Low-Power High-Speed CMOS Digital Design", IEEE Journal of Solid-State Circuits, Mar. 1998, vol. 33, No. 3, pp. 454-462.

Sedra A.S., "Microelectronic Circuits," Saunders College Publishing, 1991, pp. 930-934 & 938-939.

Seki T., et al., "Dynamic Voltage and Frequency Management for a Low-Power Embedded Microprocessor," IEICE Transactions on Electronics, Apr. 2005, vol. E88-C, No. 4, pp. 520-527.

Wei G-Y., et al., "A Fully Digital, Energy-Efficient, Adaptive Power-Supply Regulator," IEEE Journal of Solid-State Circuits, Apr. 1999, vol. 34, No. 4, pp. 520-528.

* cited by examiner

US 10,587,253 B1

RING OSCILLATOR-BASED PROGRAMMABLE DELAY LINE

FIELD

Aspects of the present disclosure relate generally to programmable delay lines, and in particular, to a ring oscillator-based programmable delay line.

DESCRIPTION OF RELATED ART

A programmable delay line may be used in many applications, such as in a digital lock loop (DLL), a phase lock loop (PLL), an oscillator, and other devices.

Certain characteristics of a programmable delay line may be desired. For instance, the programmable delay line should be implemented in a relatively small integrated circuit (IC) footprint while providing a large range of programmable delays. Another desirable characteristic is that the delay associated with a rising transition of the signal should substantially match the delay associated with a falling transition of the signal.

An additional desirable characteristic of a programmable delay line is that the delay sensitivity to supply voltage should be substantially independent of the programming code used to set the delay of the programmable delay line. A further desirable characteristic is that the programmable delay line should be easily reconfigured to provide greater programmable delays.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

An aspect of the disclosure relates to an apparatus including a pulse generator; a ring oscillator coupled to the pulse generator; a counter coupled to the pulse generator and the ring oscillator; and a gating device coupled to the counter.

Another aspect of the disclosure relates to a method including generating a pulse in response to a transition of an input signal; generating a clock in response to the pulse; changing a current count from a first value towards a second value in response to periods of the clock; and outputting the transition of the input signal to generate an output signal in response to the current count reaching the second value.

Another aspect of the disclosure relates to an apparatus including means for generating a pulse in response to a transition of an input signal; means for generating a clock in response to the pulse; means for changing a current count from a first value towards a second value in response to periods of the clock; and means for outputting the transition of the input signal to generate an output signal in response to the current count reaching the second value.

Another aspect of the disclosure relates to an apparatus including a data generating circuit configured to generate data; a programmable delay line configured to delay the data to generate a delayed data, wherein the programming delay line includes a pulse generator configured to generate a pulse in response to a transition of the data, an oscillator configured to generate a first clock in response to the pulse, a counter configured to change a current count from a first value towards a second value in response to periods of the first clock, and a gating device configured to output the transition of the data to generate the delayed data in response to the current count reaching the second value; and an error detecting circuit configured to generate an error signal in response to the delayed data not logically agreeing with the data when a triggering transition of a second clock occurs.

To the accomplishment of the foregoing and related ends, the one or more embodiments include the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the description embodiments are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
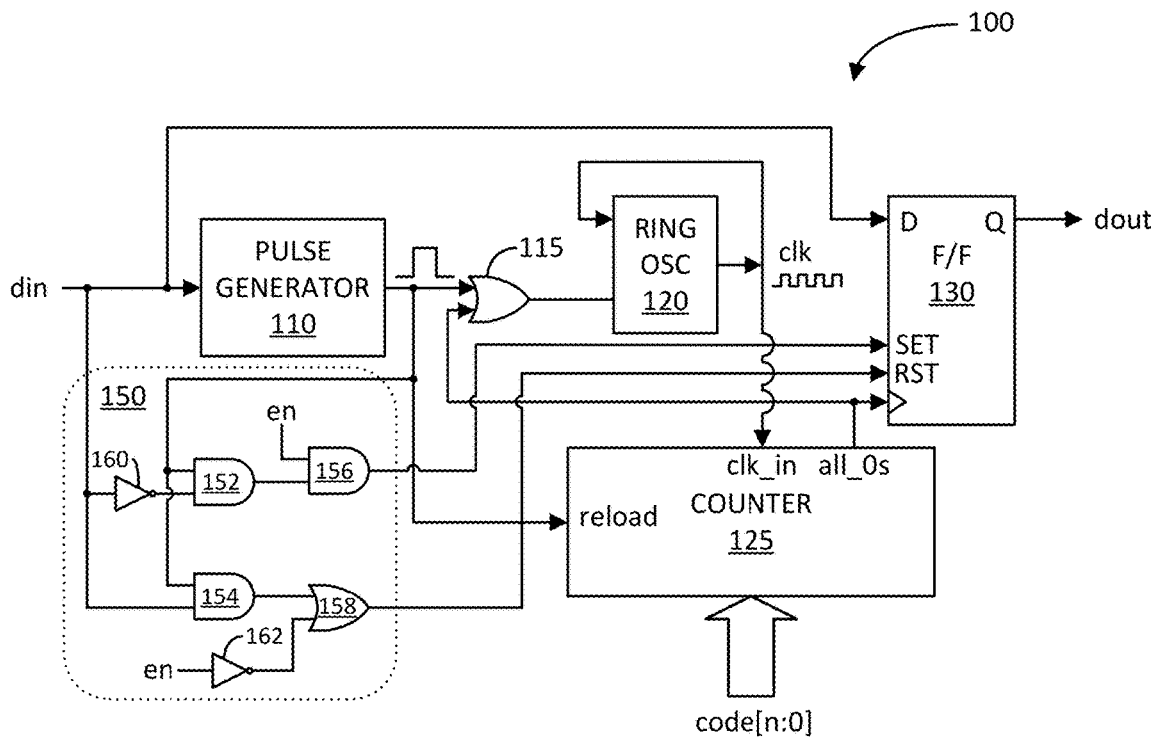
FIG. 1 illustrates a block diagram of an exemplary programmable delay line in accordance with an aspect of the disclosure.

FIG. 1 illustrates a block diagram of an exemplary programmable delay line 100 in accordance with an aspect of the disclosure. In summary, the programmable delay line 100 is configured to delay an input digital signal din by an amount dictated by a programmable code (code[n:0]) to generate an output digital signal dout.

In particular, the programmable delay line 100 includes a pulse generator 110, an OR-gate 115, a ring oscillator (RO) 120, a counter 125, a gating device 130 (e.g., a flip-flop (F/F) or latch), and a state-correction circuit 150. An input digital signal din is applied to an input of the pulse generator 110 and a data (D) input of the gating device 130. The pulse generator 110 is configured to generate a pulse in response to a transition (e.g., rise or fall) of the input digital signal din.

The pulse generator 110 includes an output coupled to a first input of the OR-gate 115 and a reload input of the counter 125. The OR-gate 115 includes an output coupled to an initialize/start/stop input of the ring oscillator 120. Accordingly, the rising (leading) edge of the pulse generated by the pulse generator 110 via the OR-gate 115 initializes the ring oscillator 120 (e.g., configures the ring-arranged set of inverters/flip-flops to output alternating high and low logic voltages, respectively). The falling (trailing) edge of the pulse via the OR-gate 115 causes the ring oscillator 120 to start generating a substantially periodic clock (clk).

The rising (leading) edge of the pulse generated by the pulse generator 110 also causes the counter 125 to load a current count to a value indicated by the programmable code (code[n:0]). As discussed in more detail herein, the counter 125 decrements the current count for each period of the clock generated by the ring oscillator 120.

The ring oscillator 120 includes an output (at which the clock is generated) coupled to a clock input of the counter 125. The counter 125 further includes an all_0s output configured to generate a de-asserted signal when the current count is not zero (0), and generate an asserted signal when the current count is zero (0). The all_0s output of the counter 125 is coupled to a clock input of the gating device 130 and to a second input of the OR-gate 115. Accordingly, when the counter 125 asserts the all_0s signal, the gating device 130 passes the input digital signal din at the D-input to the Q-output to generate the output digital signal dout. Additionally, the asserted all_0s signal via the OR-gate 115 also causes the ring oscillator 120 to cease generating the clock.

The state-correction circuit 150 ensures that the Q-output of the gating device 130 is at the same logic state as the input digital signal din immediately prior to a transition of the input digital signal din. If, otherwise, the Q-output is at a different logic state as the input digital signal din prior to the transition, the transition would not propagate to the output digital signal dout. For example, if the input digital signal din is at a low logic state and the Q-output is at a high logic state; and subsequently, there is a rising transition in the input digital signal din, the rising transition would not occur in the output digital signal dout as Q-output is already at the high logic state. This also applies if the input digital signal din at high logic state and the Q-output is at a low logic state prior to a falling transition occurring in the input digital signal din.

This condition of the Q-output being at a different logic state than the input of the programmable delay line 100 may occur for various reasons. For example, upon start-up or enabling of the programmable delay line 100, the Q-output of the gating device 130 may come up with a logic state different that the state at which the input comes up. Another reason is that during a delay interval, the delay operation may prematurely end before the transition propagates to the Q-output of the gating device 130. For example, if at the beginning of the delay interval (prior to the transition of the input digital signal din), both the input and the Q-output are both at a low logic state. Then a rising transition occurs in the input digital signal din. If the delay operation ends prematurely before the rising transition propagates to the Q-output, then at the beginning of the next delay interval, the logic state of the input digital signal din is high and the logic state of the Q-output is low.

Accordingly, the state-correction circuit 150 ensures that the Q-output or the output digital signal dout is at the same logic state as the input digital signal din at the beginning of each delay interval. In particular, the state-correction circuit 150 includes a first AND-gate 152, a second AND-gate 154, a third AND-gate 156, an OR-gate 158, a first inverter 160, and a second inverter 162. The input digital signal din is applied to an input of the first inverter 160 and a first input of the second AND-gate 154. The first inverter 160 includes an output coupled to a first input of the first AND-gate 152.

The output of the pulse generator 110 is coupled to second inputs of the first and second AND-gates 152 and 154, respectively. The first and second AND-gates 152 and 154 include outputs coupled to first inputs of the third AND-gate 156 and OR-gate 158, respectively. An enable signal en for the programmable delay line 100 is applied to a second input of the third AND-gate 156 and an input of the second inverter 162. The second inverter 162 includes an output coupled to a second input of the OR-gate 158. The third AND-gate 156 includes an output coupled to a SET input of the gating device 130. The OR-gate 158 includes an output coupled to a RESET (RST) input of the gating device 130.

The operation of the state-correction circuit 150 is as follows: Before a transition of the input digital signal din, the input data signal din may be at a low logic state and the output digital signal dout may be at a high logic state due to, for example, a start-up condition or an incomplete prior delay interval. When the input digital signal din subsequently transitions to a high logic state, the pulse generator 110 generates a pulse. This results in both inputs to the second AND-gate 154 being high (e.g., din is high and the pulse is high). Accordingly, the second AND-gate 154 generates a high, which is passed through to the RESET input of the gating device 130 by the OR-gate 158. In response to the high at the RESET input, the gating device 130 generates a logic low at the Q-output. Thus, the gating device 130 is able to output the rising transition of the input digital signal din when the all_0s output of the counter 125 is asserted in accordance with the programmed delay.

Similarly, before a transition of the input digital signal din, the input data signal din may be at a high logic state and the output digital signal dout may be at a low logic state due to, again, a start-up condition or an incomplete prior delay interval. When the input digital signal din subsequently transitions to a low logic state, the pulse generator 110 generates a pulse. The first inverter 160 inverts the low logic state of the input digital signal din to generate a high at the first input of the first AND-gate 152. Thus, both inputs to the first AND-gate 152 are high (e.g., din is high and the pulse is high). Accordingly, the first AND-gate 152 generates a high, which is passed through to the SET input of the gating device 130 by the third AND-gate 156 being enabled by the asserted enable signal en. In response to the high at the SET input, the gating device 130 generates a logic high at the Q-output. Thus, the gating device 130 is able to output the falling transition of the input digital signal din when the all_0s output of the counter 125 is asserted in accordance with the programmed delay.

When the enable signal en is deasserted (e.g., being at a low logic state), the second inverter 162 inverts the low logic state to produce a high logic state. The OR-gate 158 passes the high logic state to the RESET input of the gating device 130. In response to the high at the RESET input of the gating device 130, the gating device generates a low logic state at the Q-output. Thus, when the programmable delay line 100 is disabled, it produces a low logic (fixed known) state at the output. This is done because the input digital signal din is typically at a low logic state when the programming delay line 100 is enabled.

The programmable delaying of the input signal din to generate the output signal dout is discussed below in detail with reference to a timing diagram.

Figure 2:
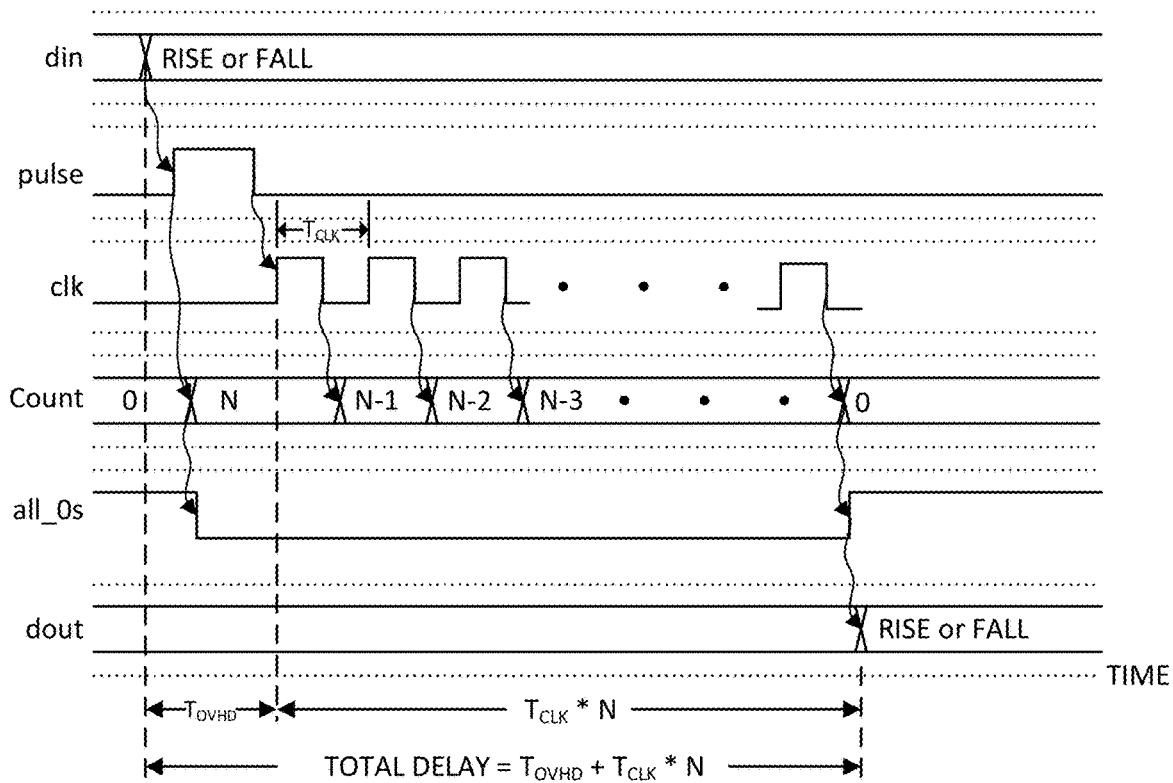
FIG. 2 illustrates a timing diagram of exemplary signals associated with an operation of the programmable delay line of FIG. 1 in accordance with another aspect of the disclosure.

FIG. 2 illustrates a timing diagram of exemplary signals associated with an operation of the programmable delay line 100 in accordance with another aspect of the disclosure. The horizontal or x-axis of the graph represents time, and the vertical or y-axis represents the logic states/value of six (6) signals depicted in six (6) rows, respectively. From top row to bottom row, the six (6) signals represented are the input data signal din, the pulse generated by the pulse generator 110, the clock generated by the ring oscillator 120, the current count of the counter 125, the state of the all_0s signal, and the output digital signal dout.

As illustrated, when the pulse generator 110 detects a transition in the input digital signal din (whether a rising or falling transition), the pulse generator 110 generates a pulse with a rising (leading) edge and a falling (trailing) edge. As discussed, the pulse is applied to an initialize/start/stop input of the ring oscillator 120 via the OR-gate 115, and to the reload input of the counter 125. The rising (leading) edge of the pulse initializes the ring oscillator 120 (e.g., causing the ring-arranged set of internal inverters/latches to generate alternating ones (1s) and zeros (0s), respectively). This condition allows the ring oscillator 120 to generate the clock when subsequently triggered by the falling (trailing) edge of the pulse.

The rising (leading) edge of the pulse generated by the pulse generator 110 also causes the counter 125 to set the current count to a value N indicated by the programming code (code[n:0]). As exemplified by the timing diagram, the current count changes from zero (0) (which may have been decremented to zero (0) in the prior delay interval) to the value N. Additionally, the rising (leading) edge of the pulse causes the counter 125 to deassert the all_0s signal as the current count is no longer zero (0).

Subsequently, the falling (trailing) edge of the pulse generated by the pulse generator 110, via the OR-gate 115, causes the ring oscillator 120 to generate the clock. Thus, as illustrated in the timing diagram, the ring oscillator 120 generates the clock with a substantially constant period of $T_{CLK}$. For each falling edge of the clock, the counter 125 decrements the current count by one (1). For example, the counter 125 has initialize the current count to N based on the programmable code[n:0]. As illustrated, the first falling edge of the clock causes the counter 125 to decrement the current count to N−1. Then, the second falling edge of the clock causes the counter 125 to decrement the current count to N−2; and so on, until the current count reaches zero (0).

When the current count reaches zero (0), the counter 125 asserts the all_0s signal. The asserted all_0s signal causes the gating device 130 to pass the input digital signal din at its D-input to its Q-output to generate the output digital signal dout. Thus, if during this delay interval, the input digital signal din experienced a rising transition, the output digital signal dout experiences a rising transition in response to the asserted all_0s signal. Similarly, if the input digital signal din experienced a falling transition, the output digital signal dout experiences a falling transition in response to the asserted all_0s signal.

The total delay applied to the input digital signal din by the programmable delay line 100, indicated by the time difference between the transition of the input digital signal din and the resulting transition of the output digital signal dout, is given by the period $T_{CLK}$ of the clock multiplied by the value N of the programmable code[n:0] plus an overhead time interval $T_{OVHD}$ between the transition of the input digital signal din and the start of the clock generated by the ring oscillator 120 (e.g., Total delay=$T_{OVHD}$ $T_{CLK}$*N).

The ring oscillator-based programmable delay line 100 has several advantages over other types of programmable delay lines, such as a multiplexer-based programmable delay line or NAND-based programmable delay line. For example, the ring oscillator-based programmable delay line 100 typically requires substantially less integrated circuit footprint than would be required by the other types of programmable delay line for a given maximum programmable delay. Secondly, the ring oscillator-based programmable delay line 100 generally has a better delay matching of the rise and fall transitions, especially when the maximum programmable delay is large.

Third, the ring oscillator-based programmable delay line 100 has a delay sensitivity versus supply voltage that is substantially independent of different programming codes as compared to other types of programmable delay lines whose delay sensitivity to supply voltage varies significantly with different programming codes. Fourth, the maximum programmable delay of the ring oscillator-based programmable delay line 100 may be easily expandable by adding one or more flip-flops to the counter 125 as compared to other types of programmable delay lines that require adding substantial delay elements to increase its maximum programmable delay.

With regard to the exemplary programmable delay line 100, it shall be understood that the counter 125 may be configured to increment the current count in response to each period of the clock instead of decrementing the count as discussed. Further, it shall be understood that the pulse generated by the pulse generator 110 may be a negative pulse instead of a positive pulse; that is, the leading edge of the pulse may be a falling edge, and the trailing edge of the pulse may be a rising edge. In such case, other components, such as the state-correction circuit 150, may need to be modified. As discussed with reference to another programmable delay line implementation, the period $T_{CLK}$ of the clock generated by the ring oscillator 120 may provide coarse delay adjustment, and another type of programmable delay line may be coupled to the programmable delay line 100 to provide fine delay adjustment.

Figure 3:
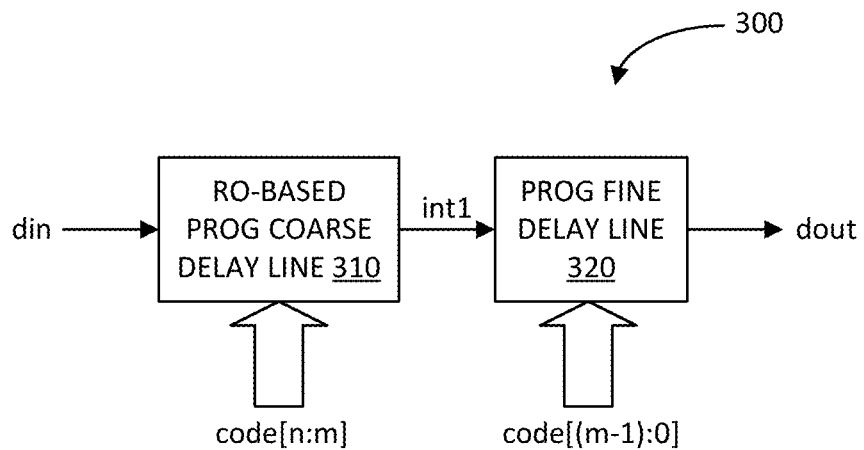
FIG. 3 illustrates a block diagram of another exemplary programmable delay line in accordance with another aspect of the disclosure.

FIG. 3 illustrates a block diagram of another exemplary programmable delay line 300 in accordance with another aspect of the disclosure. The drawback discussed above with regard to the other types of programmable delay lines (e.g., large IC footprint, fall/rise delay mismatch, and delay sensitivity versus supply voltage) may not be significant when the size or maximum programmable delay is small. Thus, the ring oscillator programmable delay line 100 may be configured for coarse delay adjustments, while another type of programmable delay line may be configured for fine delay adjustments. The programmable delay line 300 is an example of such delay line.

In particular, the programmable delay line 300 includes a ring oscillator (RO)-based programmable coarse delay line 310 coupled in series with a programmable fine delay line 320 between a signal input and a signal output. The RO-based programmable coarse delay line 310 receives an input digital signal din, and delays the input digital signal din by an amount dictated by a portion code[n:m] of a programmable code to generate a delayed intermediate signal int1. The RO-based programmable coarse delay line 310 may be configured similar to the RO-based programmable delay line 100 previously discussed.

To effectuate coarse delay adjustments, the period $T_{ax}$ of the clock generated internally within the RO-based programmable coarse delay line 310 may be configured to be K delay units, where one (1) delay unit may be the resolution of the programmable delay line 300; or more specifically, the resolution of the programmable fine delay line 320. As an example, the clock period $T_{CLK}$ may be configured to be substantially 16 delay units in duration (i.e., K=16 delay units (DUs)). Accordingly, the first-stage delay applied to the input digital signal din to generate the intermediate digital signal int1 may be given as follows:

First-stage delay=$T_{OVHD}$+$T_{CLK}$*code[n:m]=$T_{OVHD}$+ K*code[n:m]

The programmable fine delay line 320 receives the intermediate digital signal int1, and delays the intermediate digital signal int1 by an amount dictated by another portion code[m−1:0] of the programmable code to generate an output digital signal dout. The programmable fine delay line 320 may be configured similar to a multiplexer-based or NAND-based programmable delay line, as discussed further herein. To effectuate fine delay adjustments, the programmable fine delay line 320 may be configured to delay the intermediate digital signal int1 with a resolution of one (1) delay unit. As an example, the programmable fine delay line 320 may be configured to delay the intermediate digital signal int1 by a maximum amount of 15 delay units, where m=4 and n could be as large as desired.

As an example, the RO-based programmable coarse delay line 310 may be configured such that n=7 and m=4, allowing the RO-based programmable coarse delay line 310 to provide a maximum programmable delay of $K*2^4$ (e.g., 16*16=256 delay units) with a resolution of K (e.g., 16 delay units). The programmable fine delay line 320 may be configured (e.g., m=4) to provide a maximum programmable delay of K−1 (e.g., 15 delay units) with a resolution of one (1) delay unit. Thus, the programmable delay line 300 may provide a maximum delay of 271 delay units with a resolution of one (1) delay unit, discounting the overhead delay $T_{OVHD}$ previously discussed.

Although, in this example, the programmable fine delay line 320 is shown following the RO-based programmable coarse delay line 310, it shall be understood that the programmable delay line 300 may be configured such that the programmable fine delay line 320 is the first-stage and the RO-based programmable coarse delay line 310 is the second-stage. Additionally, although in this example, the programmable delay line 300 includes two programmable delay line stages, it shall be understood that the programmable delay line 300 may be configured to include more than two programmable delay line stages of the same or different types.

Figure 4:
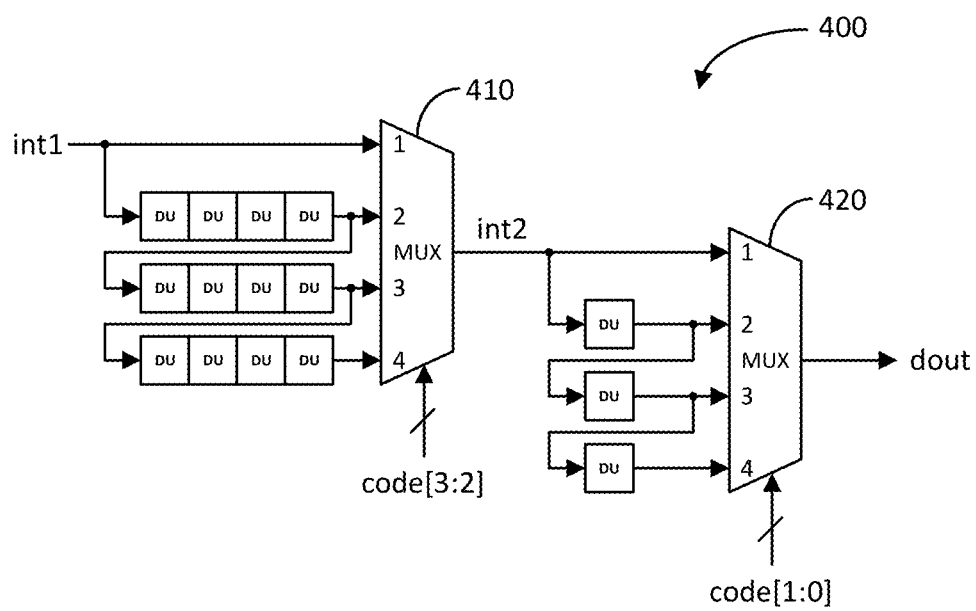
FIG. 4 illustrates a block diagram of another exemplary programmable delay line in accordance with another aspect of the disclosure.

FIG. 4 illustrates a block diagram of another exemplary programmable delay line 400 in accordance with another aspect of the disclosure. The programmable delay line 400 may be an exemplary detailed implementation of the programmable fine delay line 320 previously discussed. In this example, the programmable delay line 400 is configured as a multiplexer-based programmable delay line.

In particular, the programmable delay line 400 includes a first programmable delay stage including a first multiplexer 410 having four (4) inputs, numbered as 1-4, and an output. An input digital signal, such as the intermediate digital signal int1 previously discussed with reference to programmable delay line 300, is provided to the first input (1) of the first multiplexer 410. The first programmable delay stage further includes: a first delay line (e.g., having a fixed delay of four (4) delay units) coupled between the first input (1) and the second input (2) of the first multiplexer 410; a second delay line (e.g., having a fixed delay of four (4) delay units) coupled between the second input (2) and the third input (3) of the first multiplexer 410; and a third delay line (e.g., having a fixed delay of four (4) delay units) coupled between the third input (3) and the fourth input (4) of the first multiplexer 410. A portion (code[3:2]) of a programmable code is provided to a select input of the first multiplexer 410.

Accordingly, the first programmable delay stage of the programmable delay line 400 is configured to delay the first intermediate digital signal int1 by an amount dictated by the programmable code (code[3:2]) to generate a second intermediate digital signal int2. As such, the first programmable delay stage is configured to delay the first intermediate digital signal int1 by a maximum amount of 12 delay units with a resolution of four (4) delay units. Thus, if the value of the programmable code (code[3:2]) is 0, 1, 2, and 3, the delays effectuated by the first programmable delay stage are 0, 4, 8, and 12 delay units, respectively.

More specifically, the programmable delay of the first delay stage operates as follows: If the value of the programmable code (code[3:2]) is zero (0), the first multiplexer 410 selects the first input (1) to essentially pass the first intermediate signal int1 through without any delay to generate the second intermediate signal int2. If the value of the programmable code (code[3:2]) is one (1), the first multiplexer 410 selects the second input (2) to delay the first intermediate signal int1 by four (4) delay units via the first delay line to generate the second intermediate signal int2.

If the value of the programmable code (code[3:2]) is two (2), the first multiplexer 410 selects the third input (3) to delay the first intermediate signal int1 by eight (8) delay units via the cascaded first and second delay lines to generate the second intermediate signal int2. If the value of the programmable code (code[3:2]) is three (3), the first multiplexer 410 selects the fourth input (4) to delay the first intermediate signal int1 by 12 delay units via the cascaded first, second, and third delay lines to generate the second intermediate signal int2.

The programmable delay line 400 further includes a second programmable delay stage including a second multiplexer 420 having four (4) inputs, numbered as 1-4, and an output. The second intermediate digital signal int2 is provided to the first input (1) of the second multiplexer 420. The second programmable delay stage further includes: a first delay element (e.g., having a fixed delay of one (1) delay unit) coupled between the first input (1) and the second input (2) of the second multiplexer 420; a second delay element (e.g., having a fixed delay of one (1) delay unit) coupled between the second input (2) and the third input (3) of the second multiplexer 420; and a third delay element (e.g., having a fixed delay of one (1) delay unit) coupled between the third input (3) and the fourth input (4) of the second multiplexer 420. Another portion (code[1:0]) of the programmable code is provided to a select input of the second multiplexer 420.

Accordingly, the second programmable delay stage of the programmable delay line 400 is configured to delay the second intermediate digital signal int2 by an amount dictated by the programmable code (code[1:0]) to generate the output digital signal dout. As such, the second programmable delay stage is configured to delay the second intermediate digital signal int2 by a maximum amount of three (3) delay units with a resolution of one (1) delay unit. Thus, if the value of the programmable code (code[1:0]) is 0, 1, 2, and 3, the delays effectuated by the second programmable delay stage are 0, 1, 2, and 3 delay unit(s), respectively.

More specifically, the programmable delay of the second delay stage operates as follows: If the value of the programmable code (code[1:0]) is zero (0), the second multiplexer 420 selects the first input (1) to essentially pass the second intermediate signal int2 through without any delay to generate the output digital signal dout. If the value of the programmable code (code[1:0]) is one (1), the second multiplexer 420 selects the second input (2) to delay the second intermediate signal int2 by one (1) delay unit via the first delay element to generate the output digital signal dout.

If the value of the programmable code (code[1:0]) is two (2), the second multiplexer 420 selects the third input (3) to delay the second intermediate signal int2 by two (2) delay units via the cascaded first and second delay elements to generate the output digital signal dout. If the value of the programmable code (code[1:0]) is three (3), the second multiplexer 420 selects the fourth input (4) to delay the second intermediate signal int2 by three (3) delay units via the cascaded first, second, and third delay elements to generate the output digital signal dout.

Thus, the programmable delay line 400 is configured to delay the input signal int1 by a maximum amount of 15 delays units with a resolution of one (1) delay unit. Again, this is just an example, and the programmable delay line 400 may be configured to effectuate any desired maximum programmable delay with any desired resolution by, for example, changing the delay of each of the delay lines of the first stage, as well as changing the delay of each delay element of the second state. Additionally, the multiplexers 410 and 420 may be configured to accept more or less than four (4) inputs. Furthermore, instead of the programmable delay line 400 having two delay stages, the programmable delay line 400 may be configured with any number of stage(s).

Figure 5:
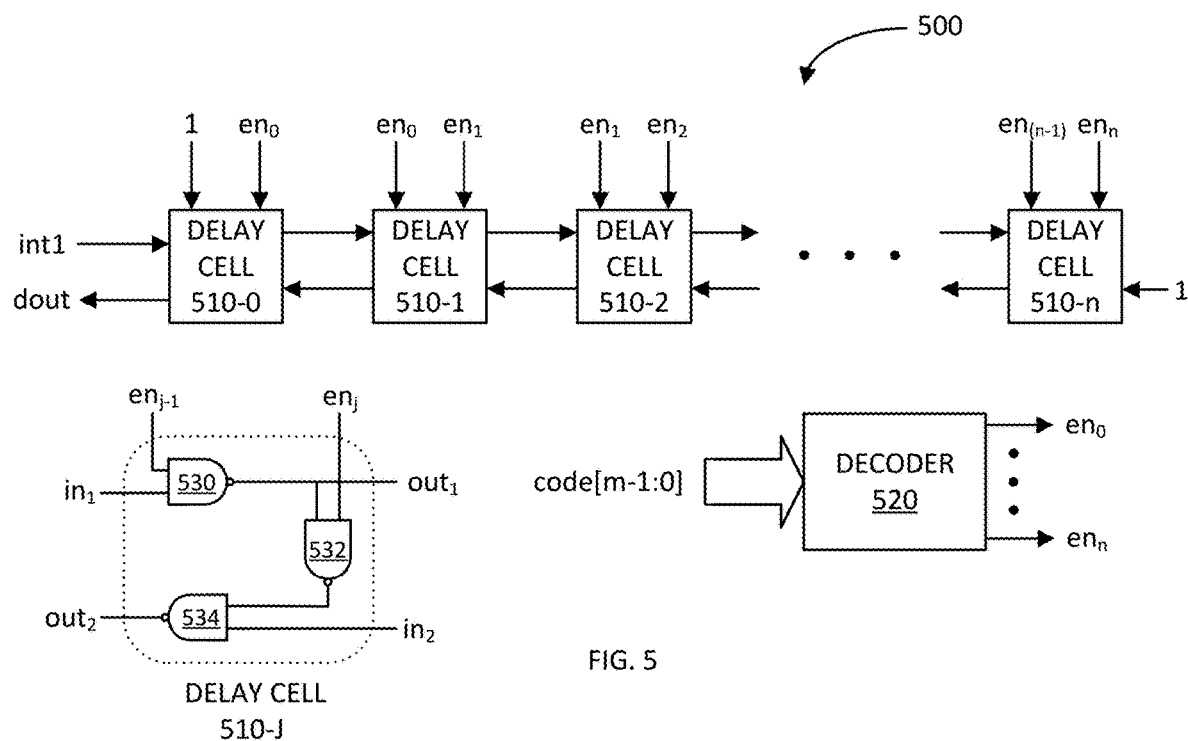
FIG. 5 illustrates a block diagram of another exemplary programmable delay line in accordance with another aspect of the disclosure.

FIG. 5 illustrates a block diagram of another exemplary programmable delay line 500 in accordance with another aspect of the disclosure. The programmable delay line 500 may be another exemplary detailed implementation of the programmable fine delay line 320 previously discussed. In this example, the programmable delay line 500 is configured as a NAND-based programmable delay line.

In particular, the programmable delay line 500 includes a set of cascaded delay cells 510-0 to 510-n. The first delay cell 510-0 in the cascaded set includes a first signal input configured to receive an input digital signal, such as the first intermediate signal int1 previously discussed. The first delay cell 510-0 also includes a first signal output coupled to a first signal input of the second delay cell 510-1 in the cascaded set. The first delay cell 510-0 also includes a second signal input coupled to a second signal output of the second delay cell 510-1. Additionally, the first delay cell 510 includes a second signal output at which the output digital signal dout is generated.

The first delay cell 510-1 includes a pair of control inputs: a first control input configured to receive a logic one (1) and a second control input configured to receive a first enable signal $en_0$. The remaining delays cells of the cascaded set may be configured similar to the first delay cell 510-0 with the exception of the last delay cell 510-n, which does not have a first signal output and a first signal input; and a further exception that the first control signal is the same as the second control signal of the previous delay cell.

A schematic view of the $J^{th}$ delay cell 510-J is shown in the lower-left portion of FIG. 5.

All of the delay cells 510-0 to 510-n may be configured similar to that of the Jth delay cell 510-J, with a couple of exceptions being the first delay cell 510-0 and the last delay cell 510-n, as discussed below in more detail.

As illustrated, the $J^{th}$ delay cell 510-J includes an input NAND-gate 530, an intermediate NAND-gate 532, and an output NAND-gate 534. The input NAND-gate 530 includes a first signal input coupled to the first signal output of the previous $(J-1^{th})$ delay cell or configured to directly receive the input digital signal int1 if the $J^{th}$ delay cell is the first one (J=0) in the cascaded set. The input NAND-gate 530 further includes a second input configured to receive a first control signal $en_{J-1}$. If the $J^{th}$ delay cell is the first one (J=0) in the cascaded set, the first control signal is fixed at a logic one (1). If the $J^{th}$ delay cell is not the first one (J≠0) in the cascaded set, the first control signal $en_{J-1}$ is the same as a second control signal of the previous $(J-1^{th})$ delay cell.

The intermediate NAND-gate 532 includes a first input coupled to an output of the input NAND-gate 530. If the $J^{th}$ delay cell is not the last delay cell (J≠n) in the cascaded set, the first input of the intermediate NAND-gate 532 serves as the first signal output of the $J^{th}$ delay cell, and is coupled to the first signal input of the following delay cell $(J+1^{th})$. If the $J^{th}$ delay cell is the last delay cell (J=n) in the cascaded set, the delay cell does not include a signal output at the first input of the intermediate NAND-gate 532. The intermediate NAND-gate 532 includes a second input configured to receive a second control signal $en_J$.

The output NAND-gate 534 includes a first input coupled to an output of the intermediate NAND gate 532. If the $J^{th}$ delay cell is not the last delay cell (J≠n) in the cascaded set, the output NAND-gate 534 includes a second input that serves as the second signal input of the $J^{th}$ delay cell and is coupled to a second signal output of the following delay cell $(J+1^{th})$. If the $J^{th}$ delay cell is the last delay cell (J=n) in the cascaded set, the second input of the output NAND-gate 534 may be configured to receive a fixed logic one (1) state. If the $J^{th}$ delay cell is not the first delay cell (J≠0) of the cascaded set, the output NAND-gate 534 includes an output, which serves as the second signal output of the Jth delay cell and is coupled to the second signal input of the previous delay cell $(J-1^{th})$. If the $J^{th}$ delay cell is the first delay cell (J=1) of the cascaded set, the output NAND-gate 534 includes an output that produces the output digital signal dout.

The programming delay line 500 further includes a decoder 520 (e.g., a thermometer decoder) configured to generate or assert the control signals $en_0$ to $en_n$ based on an input programming code (code[m−1:0]).

The signal delaying operation of the programming delay line 500 is as follow: The decoder 520, operating as a thermometer decoder, asserts as many control signals starting with $en_0$ and towards $en_n$ based on the programming code (code[m−1:0]). For example, if the programming code (code[m−1:0]) has a value of zero (0), the decoder 520 asserts control signal $en_0$ and deasserts control signals $en_1$ to $en_n$. The asserted control signal $en_0$ enables the intermediate NAND-gate 532 of the first delay cell 510-0, and the deasserted control signals $en_1$ to $en_n$ disables the remaining delay cells 510-1 to 510-n. Thus, the delay applied to the input digital signal int1 to generate the output digital signal dout is a three-NAND-gate delay effectuated by the first delay cell 510-0.

If the programming code (code [m−1:0]) has a value of J, the decoder 520 asserts control signals $en_0$ to $en_J$ and deasserts control signals $en_{J+1}$ to $en_n$. The asserted control signals $en_0$ to $en_J$ enable the intermediate NAND-gates 532 of delay cells 510-0 to 510-J, and the deasserted control signals $en_{J+1}$ to $en_n$ disable the remaining delay cells 510-J+1 to 510-n. Thus, the delay applied to the input digital signal int1 to generate the output digital signal dout is a three-NAND-gate times J delay effectuated by delay cells 510-0 to 510-J.

Finally, if the programming code (code[m−1:0]) has a value of n, the decoder 520 asserts all control signals $en_0$ to $en_n$. The asserted control signals $en_0$ to $en_n$ enable the intermediate NAND-gates 532 of all delay cells 510-0 to 510-n. Thus, the delay applied to the input digital signal int1 to generate the output digital signal dout is a three-NAND-gate times n delay effectuated by delay cells 510-0 to 510-n.

The programming delay lines 100 and 300 may be used in many applications, such as in a digital lock loop (DLL), phase lock loop (PLL), oscillators, etc. One particular application of interest is the use of the programmable delay lines 100 and 300 in a dynamic variation monitor (DVM). As discussed in more detail further herein, a DVM is used to detect significant droop in a power supply voltage. A DVM may be used in an adaptive clock distribution (ACD) circuit configured to reduce the frequency of a clock applied to a core circuit, such as a central processing core or graphics processing core, when the DVM has detected the significant supply voltage droop.

Figure 6:
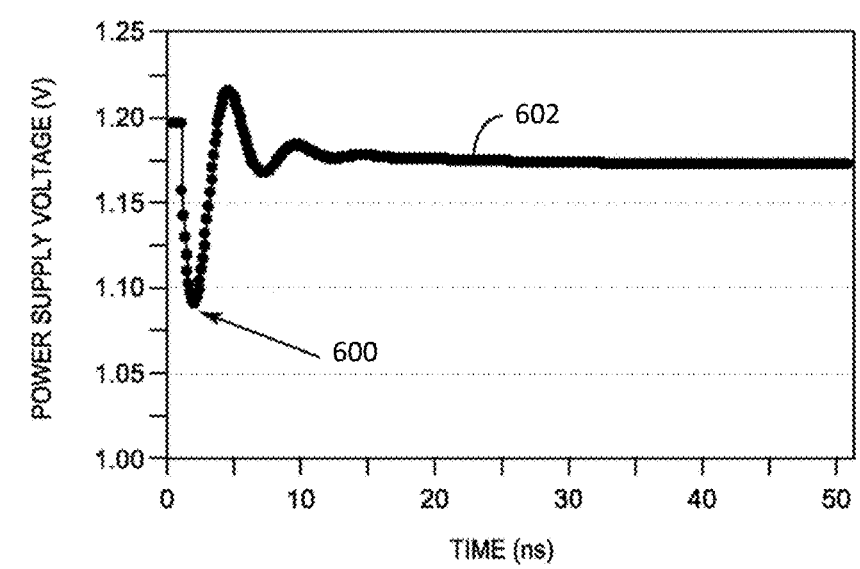
FIG. 6 illustrates a graph of an exemplary power supply voltage experiencing a droop in accordance with another aspect of the disclosure.

FIG. 6 illustrates a graph depicting an example of a power supply voltage droop 600 occurring in a supply voltage 602 in accordance with another aspect of the disclosure. As shown, the power supply voltage droop 600 is a temporary drop or reduction (e.g., 10 nanoseconds (ns)) in the power supply voltage 602 being supplied by a power supply. Reasons for the power supply voltage droop 600 may include an abrupt increase in demand in power supply current supplied by the power supply, inducing large current transients in a power delivery system, and/or an operational change to the power supply. The magnitude and duration of the voltage droop 600 depends on the interaction of capacitive and inductive parasitics associated with printed circuit board (PCB), integrated circuit (IC) package, and die levels with changes in current demand Thus, voltage droop 600 affects circuits globally across a die and may occur with frequencies ranging in delay from a few nanoseconds (ns) (e.g., high frequency) to a few microseconds (ms) (e.g., low frequency).

Figure 7:
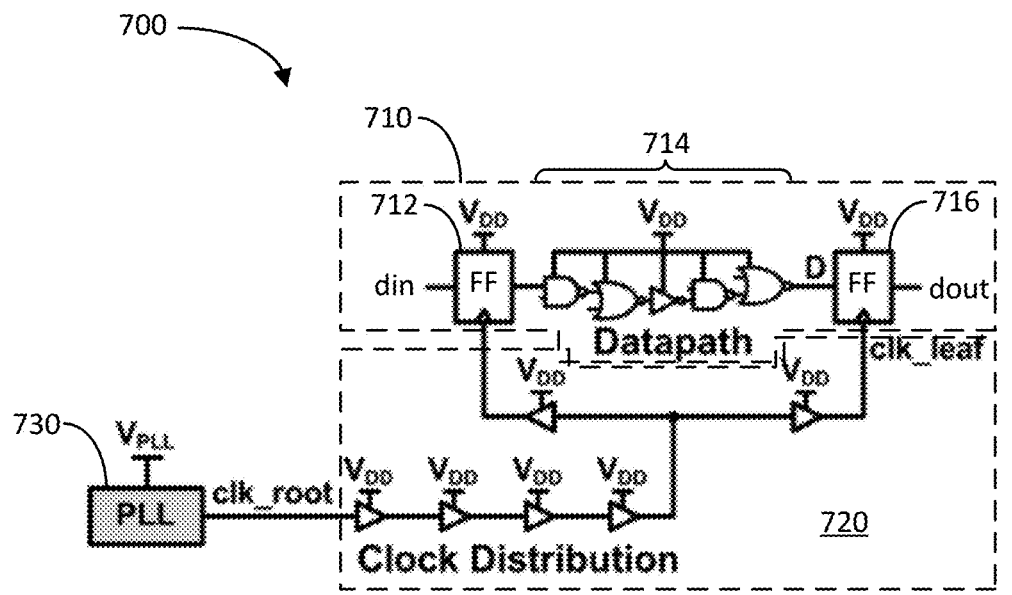
FIG. 7 illustrates a schematic diagram of a portion of exemplary integrated circuit (IC) core in accordance with another aspect of the disclosure.
Figure 7:
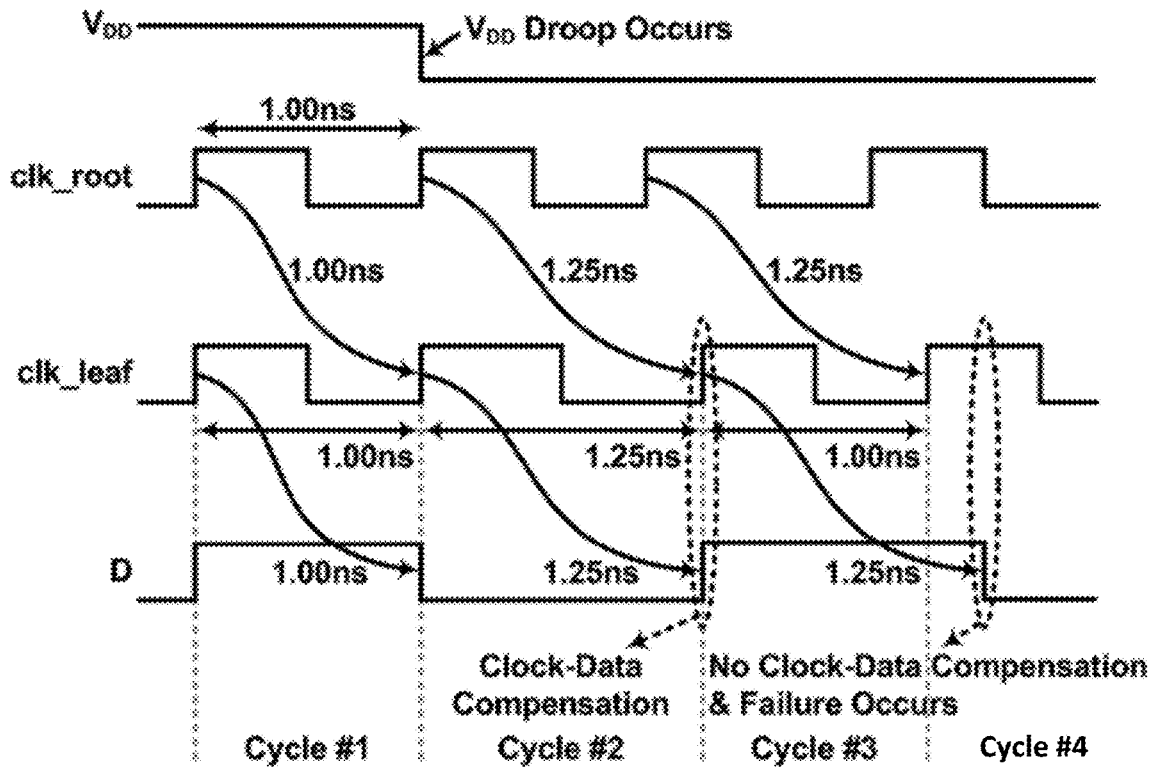

FIG. 7 illustrates a schematic diagram of at least a portion of an exemplary IC core 700 in accordance with another aspect of the disclosure. The IC core 700 may be a central processing unit (CPU) core, graphics processing unit (GPU) core, digital signal processing (DSP) core, or other type of core. The portion of the IC core 700 illustrated may pertain to a critical datapath.

In particular, the IC core 700 includes a datapath 710, a clock distribution tree 720, and a phase lock loop (PLL) 730. The datapath 710 includes an input flip-flop 712, a combinational logic 714, and an output flip-flip 716. An input data signal din is applied to an input of the input flip-flop 712. The combinational logic 714 is coupled between an output of the input flip-flop 712 and an input of the output flip-flop 716. The output flip-flop 716 includes an output configured to produce an output data signal dout. The input and output flip-flops 712 and 716 include clock inputs configured to receive a clock clk_leaf. The flip-flops 712 and 716 and the combination logic 714 are configured to receive a supply voltage $V_{DD}$.

The PLL 730 is configured to generate a clock clk_root. The PLL 730 receives a supply voltage $V_{PLL}$. The supply voltage $V_{PLL}$ is different than the supply voltage $V_{DD}$ associated with the datapath 710 and clock distribution tree 720, as discussed below. Thus, the supply voltage $V_{PLL}$ for the PLL 730 is substantially independent of a droop occurring in the supply voltage $V_{DD}$ for the datapath 710 and the clock distribution tree 720.

The clock distribution tree 720 is configured to route the clock clk_root from the PLL 730 to generate the clock clk_leaf at the clock inputs of the flip-flops 712 and 716. In this example, the clock distribution tree 720 includes a set of four (4) inverters for routing the clock to a junction node. The clock distribution 720 further includes an inverter for routing the clock from the junction node to the clock input of the input flip-flop 712. Additionally, the clock distribution tree 720 includes another inverter for routing the clock from the junction node to the clock input of the output flip-flop 716.

The clock distribution tree 720 is configured to delay the clk_root to generate the clk_leaf substantially the same amount as the propagation delay of the data (D) from the input of the input flip-flop 712 to the input of the output flip-flop 716. In this example, the delay between the input of the input flip-flop 712 to the input of the output flip-flop 716 is one (1) ns. Accordingly, the delay between the PLL 730 and the clock inputs of the flip-flops 712 and 716 is also one (1) ns.

Also included in FIG. 7 is a timing diagram associated with an operation of the IC core 700. The x- or horizontal axis of the diagram represents time, which is partitioned into four (4) cycles of the clk_root. The y- or vertical axis represents amplitude or logic levels of, from top row to bottom row, the supply voltage $V_{DD}$, clk_root, clk_leaf, and data (D).

According to the timing diagram, during the first clock cycle (Cycle #1), the supply voltage $V_{DD}$ for the data path 710 and the clock distribution tree 720 is operating at normal or desired level. At such supply level, the delays of the data (D) through the datapath 710 and the clk_root through the clock distribution tree 720 are substantially the same (e.g., 1 ns). Accordingly, during the first clock cycle (Cycle #1), the edge or transition of the clk_leaf substantially lines up with the edge or transition of the data (D) at the clock and data inputs of the output flip-flop 716. Thus, no margin error occurred during the first clock cycle (Cycle #1).

At the beginning of the second clock cycle (Cycle #2), there is a droop in the supply voltage $V_{DD}$. However, as previously discussed, the PLL 730 operates under a different supply voltage $V_{PLL}$, which is substantially independent of the supply voltage $V_{DD}$. Thus, in this example, the clk_root generated by the PLL 730 is not affected by the droop, and its period is still one (1) ns.

As discussed, the supply voltage $V_{DD}$ is applied to the datapath 710 and the clock distribution tree 720. Thus, the delay through the datapath 710 and the clock distribution tree 720 is affected, or more accurately, increased due to the droop in the supply voltage $V_{DD}$. In this example, the delay through both the datapath 710 and the clock distribution tree 720 increases to 1.25 ns. Generally, the clock distribution tree 720 is configured to have substantially the same delay-to-supply voltage sensitivity as that of the datapath 710. Thus, during the second clock cycle (Cycle #2), the edge or transition of the clk_leaf substantially lines up with the edge or transition of the data (D) at the clock and data inputs of the output flip-flop 716. Thus, no margin error occurred during the second clock cycle (Cycle #2).

As the clk_root is not affected by the voltage droop, the rising edge of the clk_root starts 0.25 ns before the rising edge of the clk_leaf and the data (D). Accordingly, during the third clock cycle (Cycle #3), the earlier rising edge of the clk_root results in the rising edge of the clk_leaf arriving 0.25 ns earlier than the data (D). Thus, during the third clock cycle (Cycle #3), a timing margin error results.

Typically, in an integrated circuit (IC), an adaptive clock distribution (ACD) circuit is provided to address the timing margin problems associated with a droop in the supply voltage $V_{DD}$ for the datapath 710 and the clock distribution tree 720. The ACD circuit performs two main operations:

First, it provides additional delay between the clk_root and the clk_leaf to address the timing margin issue while the clk_root is operating at its normal or desired frequency (e.g., f=1/1 ns=1 GHz). For instance, in this example, if the ACD circuit provides 0.25 ns additional delay, during the third clock cycle (Cycle #3), the edge or transition of the clk_leaf aligns with the edge or transition of the data (D); and thus, no timing margin error occurs. The additional delay provided by an ACD circuit may ensure that timing margin errors do not occur for one or more cycles of the clk_root after a voltage droop occurs. This allows time for the ACD circuit to perform the second operation of detecting the voltage droop and lowering the frequency of the clk_leaf to resolve timing issues as a result of the voltage droop. When the voltage droop condition no longer exists, the ACD circuit returns the clk_leaf to the normal frequency.

Figure 8:
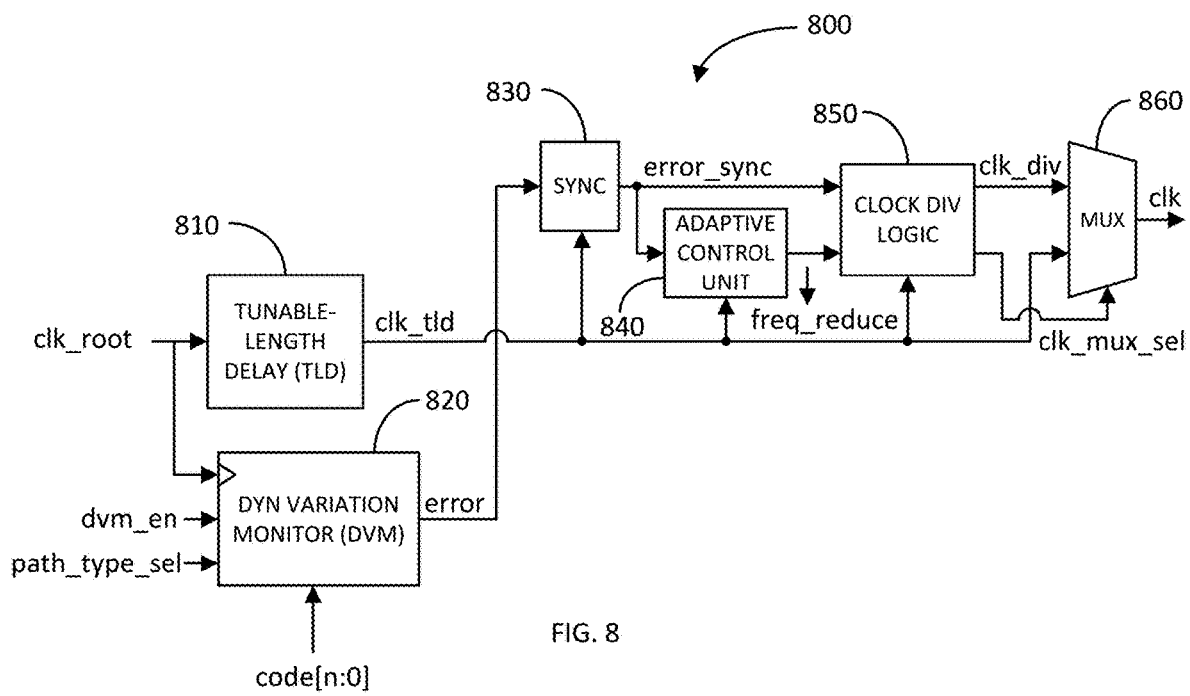
FIG. 8 illustrates a block diagram of an exemplary adaptive clock distribution (ACD) circuit in accordance with another aspect of the disclosure.

FIG. 8 illustrates a block diagram of an exemplary adaptive clock distribution (ACD) circuit 800 in accordance with another aspect of the disclosure. The ACD 800 includes a tunable length delay (TLD) 810, a dynamic variation monitor (DVM) 820, a synchronization circuit 830, an adaptive control unit (ACU) 840), a clock divider logic 850, and a multiplexer 860.

The clk_root generated by the PLL 730 is provided to the TLD 810. The TLD 810 applies a calibrated delay to the clk_root to generate a delayed clock clk_tld. Via the multiplexer 860, the clk_tld is provided to the clock distribution tree 720 during normal operation and during one or more clock cycles after a droop in the supply voltage $V_{DD}$ has occurred. The calibrated delay applied to the clk_root to generate the clk_tld temporarily addresses the timing margin issues for one or more clock cycles after a voltage droop occurs.

The clk_root is also provided to the DVM 820, along with an enable signal dvm_en, a path type select signal path_type_sel, and a programming code[n:0] for a programmable delay line internal to the DVM 820. This programmable delay line may be configured as programmable delay line 100 and 300 previously discussed. The DVM 820 is configured to detect the droop in the supply voltage $V_{DD}$, and, in response, assert the error signal; otherwise, the error signal remains deasserted when no voltage droop is detected. The enable signal dvm_en enables the voltage droop detection operation of the DVM 820. The path_type_sel signal is for setting the delay sensitivity to supply voltage to substantially match the delay sensitivity to supply voltage of the datapath 710, as discussed in more detail further herein.

The synchronization circuit 830 receives the error signal from the DVM 820 and the clk_tld from the TLD 810. The synchronization circuit 830 is configured to generate an error_sync signal, which is the same as the error signal from the DVM 820 but synchronized with the negative edge of the clk_tld. The error_sync signal is provided to the ACU 840 and the clock divider logic 850.

In response to the error_sync signal, the clock divider logic 850 generates a clock clk_div, whose frequency is reduced compared to the frequency of the clk_tld (e.g., by dividing the frequency of the clk_tld by two or some other factor). Also, in response to the error_sync signal, the ACU 840 asserts a freq_reduce signal and provides it to the clock divider logic 850. In response to the asserted freq_reduce signal, the clock divider logic 850 generates or configures a clk_mux_sel signal to cause the multiplexer 860 to select and output the clk_div for the clock distribution tree 720. Thus, when a voltage droop has been detected by the DVM 820, the synchronization 830, ACU 840, clock divider logic 850, and multiplexer 860 collectively provide a reduced frequency clock to the clock distribution tree 720 to reduce the impact of the voltage droop on the operation of the datapath 710 (e.g., essentially eliminating timing errors due to the droop).

When the voltage droop condition is no longer present, the DVM 820 deasserts the error signal. In response to the deasserted error signal, the synchronization circuit 830 deasserts the error_sync signal. In response to the deasserted error_sync signal, the ACU 840 initializes a counter to count upwards or downwards towards a threshold. When the count equals the threshold, the ACU 840 deasserts the freq_reduce signal. In response to the deasserted freq_reduce signal, the clock divider logic 850 generates or configures the clk_mux_sel signal to cause the multiplexer 860 to select and output the clk_tld for the clock distribution tree 720.

Thus, the ACD circuit 800 temporarily deals with potential timing error issues due to droop in the supply voltage $V_{DD}$ by delaying the clk_root to generate the clk_tld and apply it to the clock distribution tree 720 to allow the DVM 820 and the other circuitry to respond to the voltage droop. As discussed, the DVM 820 detects the voltage droop, and the synchronization circuit 830, ACU 840, clock divider logic 850, and multiplexer 860 are configured to reduce the frequency of the clock applied to the clock distribution tree 720 when the droop is detected. When the droop no longer exists as indicated by the DVM 820 deasserting the error signal, the synchronization circuit 830, ACU 840, clock divider logic 850, and multiplexer 860 are configured to bring back the frequency of the clock applied to the clock distribution tree 720 to normal frequency.

Figure 9:
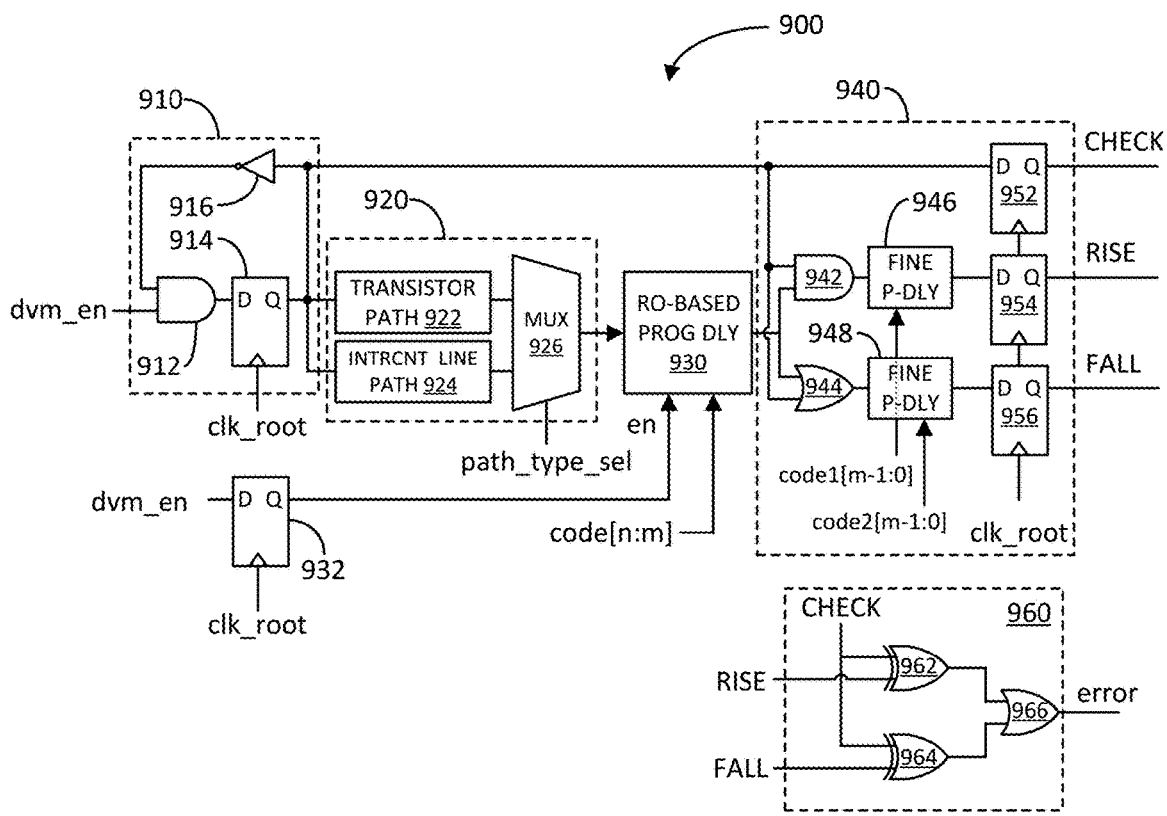
FIG. 9 illustrates a block/schematic diagram of an exemplary dynamic variation monitor (DVM) in accordance with another aspect of the disclosure.

FIG. 9 illustrates a block/schematic diagram of an exemplary dynamic variation monitor (DVM) 900 in accordance with another aspect of the disclosure. The DVM 900 may be an exemplary detailed implementation of the DVM 820. As previously discussed, the DVM 900 is an example of an application for the programmable delay lines 100 and 300 previously discussed.

In summary, the DVM 900 basically replicates the datapath 710 from a delay perspective with the exception that it is clocked directly by the clk_root instead of the clk_leaf. Thus, any significant deviation of the replicated delay of the DVM 900 with respect to the clk_root due to a droop in the supply voltage $V_{DD}$ results in an error signal generated or asserted, which the other components of the ACD circuit 800 responds to reduce the frequency of the clock provided to the clock distribution tree 720, as previously discussed in detail.

In particular, the DVM 900 includes a data generating circuit 910 configured to generate data in the form of alternating ones (1s) and zero (0s) when enabled by a DVM enabling signal dvm_en. More specifically, the data generating circuit 910 includes an AND-gate 912, a flip-flop 914, and an inverter 916. The AND-gate 912 includes a first input configured to receive the DVM enabling signal dvm_en, and a second input coupled to an output of the inverter 916. The AND-gate 912 includes an output coupled to the data (D) input of the flip-flop 914. The flip-flop 914 includes a clock input configured to receive the clk_root from the PLL 730. The flip-flop 914 includes a Q-output coupled to an input of the inverter 916.

When the dvm_en is asserted (e.g., a logic one (1)), the AND-gate 912 passes the output of the inverter 916 to the D-input of the flip-flop 914. Because the inverter 916 inverts the Q-output of the flip-flop 914, the logic state of the Q-output is opposite the logic state of the D-input of the flip-flop. Accordingly, each clock cycle of the clk_root causes the flip-flop 914 to change the logic state of the Q-output; thereby, resulting in the data generating circuit 910 generating alternating ones (1s) and zero (0s). With reference to the datapath 710, the flip-flop 914 in equivalent to the input flip-flop 712 of the datapath 710.

The DVM 900 further includes a delay section configured to replicate the delay of the combinational logic 714 of the datapath 710. In particular, the delay section includes a datapath type selection circuit 920 and a ring-oscillator (RO)-based programmable delay line 930. The datapath type selection circuit 920 is configured to provide a delay-to-supply-voltage sensitivity that substantially matches that of the combinational logic 714. The delay-to-supply-voltage sensitivity is different for a combinational logic that is more transistor-based than one that is more interconnect line-based.

Thus, if the combinational logic 714 is more transistor-based, the datapath type selection circuit 920 may be configured to provide a delay with a delay-to-supply-voltage sensitivity that better matches that of a transistor-based combinational logic 714. If the combinational logic 714 is more interconnect line-based, the datapath type selection circuit 920 may be configured to provide a delay with a delay-to-supply-voltage sensitivity that better matches that of an interconnect line-based combinational logic 714.

In this regard, the datapath type selection circuit 920 includes a transistor-based path 922, an interconnect line-based path 924, and a multiplexer 926. The transistor-based and interconnect-line-based paths 922 and 924 include inputs coupled to the Q-output of the flip-flop 914 of the data generating circuit 910. The transistor-based path 922 includes an output coupled to a first input of the multiplexer 926. The interconnect line-based path 924 includes an output coupled to a second input of the multiplexer 926. The multiplexer 926 includes a select input configured to receive the path_type_sel signal, and an output configured to generate an intermediate delayed data, which is the data generated by the data generating circuit 910 delayed by the datapath type selection circuit 920.

Thus, if the combinational logic 714 of the datapath 710 is more transistor-based, then the path_type_sel signal is set to cause the multiplexer 926 to select its first input, so as to couple the output of the transistor-based path 922 to its output. If the combinational logic 714 of the datapath 710 is more interconnect line-based, then the path_type_sel signal is set to cause the multiplexer 926 to select its second input, so as to couple the output of the interconnect line-based path 924 to its output.

The remaining part of the delay section of the DVM 900 is the RO-based programmable delay line 930. As previously discussed, the RO-based programmable delay line 930 may be configured as programmable delay line 100 previously discussed. The RO-based programmable delay 930 includes an input coupled to an output of the datapath type selection circuit 920 and an output configured to produce a completely delayed signal for error detection purpose, which is the data generated by the data generating circuit 910 delayed by the datapath type selection circuit 920 and the RO-based programmable delay line 930.

The RO-based programmable delay line 930 includes an input to receive an enable signal en, which is the same enable signal en discussed with reference to RO-based programmable delay line 100. Associated with the RO-based programmable delay line 930, the DVM 900 includes a flip-flop 932 including a D-input configured to receive the dvm_en signal, a clock input configured to receive clk_root, and a Q-output configured to output the enable signal en for the RO-based programmable delay line. Thus, the enabling of the RO-based programmable delay line 930 is synchronous with the clk_root.

As discussed, the combined delay effectuated by the datapath type selection circuit 920 and the RO-based programmable delay 930 should substantially match the delay of the combinational logic 714 of the datapath 710, and should be slightly less than a period of the clk_root to provide sufficient margin such that an error is not triggered for small variations of the supply voltage $V_{DD}$. As implied, the supply voltage $V_{DD}$ is provided to the datapath type selection circuit 920 and the RO-based programmable delay line 930 so that the overall delay is a function of $V_{DD}$. A programmable code[n:m] is provided to the RO-based programmable delay line 930 to program the appropriate delay for the RO-based programmable delay line.

The DVM 900 further includes an error detection circuit 940 configured to generate a RISE or FALL transition error signal based on whether a droop in the supply voltage $V_{DD}$ increases the overall delay effectuated by the delay section of the DVM 900 to produce data discrepancy at the input of the error detection circuit. The error detection circuit 940 includes an AND-gate 942, an OR-gate 944, first and second programmable fine delay lines 946 and 948, and three (3) flip-flops 952, 954, and 956.

The AND-gate 942 includes a first input coupled to the Q-output of the flip-flop 914, and a second input coupled to the output of the RO-based programmable delay line 930. The OR-gate 944 includes a first input coupled to the Q-output of the flip-flop 914, and a second input coupled to the output of the RO-based programmable delay line 930. The AND-gate 942 includes an output coupled to an input of the programmable fine delay line 946. The OR-gate 944 includes an output coupled to an input of the programmable fine delay line 948.

The programmable fine delay line 946 includes an output coupled to the D-input of the flip-flop 954. The programmable fine delay line 948 includes an output coupled to the D-input of the flip-flop 956. Each of the programmable fine delay lines 946 and 948 may be configured as the multiplexer-based programmable delay line 400 or the NAND-based programmable delay line 500. One purpose of the programmable fine delay lines 946 and 948 is to substantially match the delay associated with the rise transition with the delay of the fall transition. To effectuate the delay matching, the programmable fine delay lines 946 and 948 receive programming codes code1[m–1:0] and code2[m–1:0] for programming their respective delays.

The flip-flop 952 includes a D-input coupled to the Q-output of the flip-flop 914 of the data generating circuit 910. The flip-flops 952, 954, and 956 include clock inputs configured to receive the clk_root. The flip-flop 952 includes a Q-output configured to output the clocked data from the clock generating circuit 910 as a CHECK signal. The flip-flop 954 includes a Q-output configured to output a RISE transition error signal every, for example, odd clock cycle. The flip-flop 956 includes a Q-output configured to output a FALL transition error signal every, for example, even clock cycle. With reference to the datapath 710, the flip-flops 954 and 956 are essentially equivalent to the output flip-flop 716.

The DVM 900 further includes an output circuit 960 configured to generate the error signal based on the CHECK signal, RISE transition error signal, and the FALL transition error signal. In particular, the output circuit 960 includes a first exclusive-OR gate 962, a second exclusive-OR gate 964, and an OR-gate 966. The first and second exclusive-OR gates 962 and 964 include respective first inputs configured to receive the CHECK signal from the Q-output of the flip-flop 952. The first exclusive-OR gate 962 includes a second input configured to receive the RISE transition error signal from the Q-output of the flip-flop 954. The second exclusive-OR gate 964 includes a second input configured to receive the FALL transition error signal from the Q-output of the flip-flop 956.

The first exclusive-OR gate 962 includes an output coupled to a first input of the OR-gate 966. The second exclusive-OR gate 964 includes an output coupled to a second input of the OR-gate 966. The OR-gate 966 includes an output configured to produce the error signal. The error signal is the one applied to the synchronization circuit 830 of the ACD 800.

The voltage drop detection operation of the DVM 900 is as follows. In the following examples, it is assumed that the DVM 900 is enabled by the asserted state of the dvm_en signal. As discussed, the dvm_en signal being in the asserted state enables the data generating circuit 910, and also ensures that the input and output logic states of the RO-based programmable delay line 930 are the same prior to the data transition propagating to the output of the RO-based programmable delay line 930, as discussed in detail with reference to RO-based programmable delay line 100.

Considering first a rise data transition: the resulting high logic state of the rise transition propagates with substantially no delay to the first inputs of the AND-gate 942, OR-gate 944 and the D-input of the flip-flop 952. As this is an error detection interval associated with a rise transition, the OR-gate 944 always outputs a logic one (1), and does not affect the error signal output as discussed further herein. The high logic state also propagates to the second input of the AND-gate 942 via the datapath type selection circuit 920 and the RO-based programming delay line 930. If no voltage droop occurred during this clock cycle, the high logic state arrives at the AND-gate 942 prior to the clocking edge of the clk_root. Thus, as both inputs to the AND-gate 942 are high, the AND-gate 942 outputs a high, which is applied to the D-input of the flip-flop 954.

When the clocking edge of the clk_root arrives at the clock inputs of the flip-flops 952, 954, and 956, the flip-flops 952, 954, and 956 each output a logic one (1). The first exclusive-OR gate 962, having both inputs at logic high states (CHECK=RISE=1), outputs a logic low. Similarly, the second exclusive-OR gate 964, having both inputs at logic high states (CHECK=FALL=1), also outputs a logic low. The OR-gate 966, having both inputs at logic low states, outputs the error signal as a logic low (deasserted) to indicate that no error occurred because a voltage droop was not detected.

If, on the other hand, a droop in the supply voltage $V_{DD}$ occurred, which resulted in increased delay applied to the high logic state by the datapath type selection circuit 920 and the RO-based programming delay line 930, the high logic state does not arrive at the second input of the AND-gate 942 when the clock edge of the clk_root arrives at the inputs of the flip-flops 952, 954, and 956. Since the clock cycle prior to the rise transition, a fall transition occurred, the second input of the AND-gate 942 is low. As a result, the AND-gate 942 outputs a logic zero (0). Accordingly, the flip-flops 952, 954, and 956 output logic high, low, and high, respectively.

The first exclusive-OR gate 962, having one input high (CHECK=1) and another input low (RISE=0), outputs a logic high. The second exclusive-OR gate 964, having both inputs at logic high states (CHECK=FALL=1), outputs a logic low. The OR-gate 966, having one input being high, outputs the error signal as a logic high (asserted) to indicate that an error occurred due a voltage droop. Thus, in this case, the ACD circuit 800 responds to the asserted error signal to reduce the frequency of the clock applied to the clock distribution tree 720, as previously discussed in detail.

Considering next a fall data transition: the resulting low logic state of the fall transition propagates with substantially no delay to the first inputs of the AND-gate 942, OR-gate 944 and the D-input of the flip-flop 952. As this is an error detection interval associated with a fall transition, the AND-gate 942 always outputs a logic zero (0). The low logic state also propagates to the second input of the OR-gate 944 via the datapath type selection circuit 920 and the RO-based programming delay line 930. If no voltage droop occurred during this clock cycle, the low logic state arrives at the OR-gate 944 prior to the clocking edge of the clk_root. Thus, as both inputs to the OR-gate 944 are low, the OR-gate 944 outputs a low, which is applied to the D-input of the flip-flop 956.

When the clocking edge of the clk_root arrives at the clock inputs of the flip-flops 952, 954, and 956, the flip-flops 952, 954, and 956 each output a logic zero (0). The first exclusive-OR gate 962, having both inputs at logic low states (CHECK=RISE=0), outputs a logic low. Similarly, the second exclusive-OR gate 964, having both inputs at logic low states (CHECK=FALL=0), also outputs a logic low. The OR-gate 966, having both inputs at logic low states, outputs the error signal as a logic low (deasserted) to indicate that no error occurred due to a voltage droop.

If, on the other hand, a droop in the supply voltage $V_{DD}$ occurred, which resulted in an increased delay applied to the low logic state applied by the datapath type selection circuit 920 and the RO-based programming delay line 930, the low logic state does not arrive at the second input of the OR-gate 944 when the clock edge of the clk_root arrives at the inputs of the flip-flops 952, 954, and 956. Since the clock cycle prior to the fall transition, a rise transition occurred, the second input of the OR-gate 944 is high. As a result, the OR-gate 944 outputs a logic one (1). Accordingly, the flip-flops 952, 954, and 956 output logic low, low, and high, respectively.

The first exclusive-OR gate 962, having both inputs low (CHECK=RISE=0), outputs a logic low. The second exclusive-OR gate 964, having one input low (CHECK=0) and the other input high (FALL=1), outputs a logic high. The OR-gate 966, having one input being high, outputs the error signal as a logic high (asserted) to indicate that an error occurred due a voltage droop. Thus, in this case, the ACD circuit 800 responds to the asserted error signal to reduce the frequency of the clock applied to the clock distribution tree 720, as previously discussed in detail.

Figure 10:
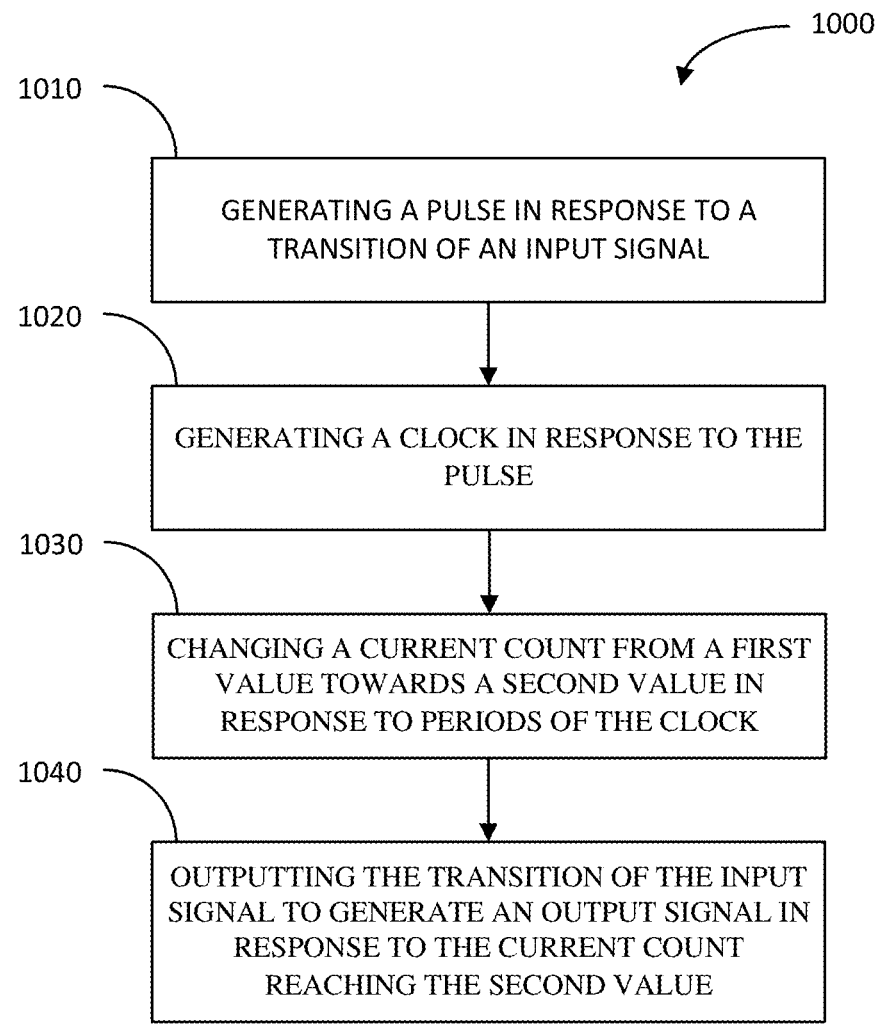
FIG. 10 illustrates a flow diagram of an exemplary method of delaying an input signal to generate an output signal in accordance with another aspect of the disclosure.

FIG. 10 illustrates a flow diagram of an exemplary method 1000 of delaying an input signal to generate an output signal in accordance with another aspect of the disclosure.

The method 1000 includes generating a pulse in response to a transition of an input signal (block 1010). An example of a means for generating a pulse in response to a transition of an input signal includes the pulse generator 110.

The method 1000 further includes generating a clock in response to the pulse (block 1020). An example of a means for generating a clock in response to the pulse includes the ring oscillator 120.

The method 1000 further includes changing a current count from a first value towards a second value in response to periods of the clock (block 1030). An example of a means for changing a current count from a first value towards a second value in response to periods of the clock includes the counter 125.

The method 1000 further includes outputting the transition of the input signal to generate an output signal in response to the current count reaching the second value (block 1040). An example of means for outputting the transition of the input signal to generate an output signal in response to the current count reaching the second value includes the gating device 130.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed:

1. An apparatus, comprising:
   a pulse generator configured to generate a pulse in response to a transition of an input signal;
   a ring oscillator coupled to the pulse generator, the ring oscillator configured to generate a clock in response to the pulse;
   a counter coupled to the pulse generator and the ring oscillator, the counter configured to count from a first value towards a second value in response to the clock; and
   a gating device coupled to the counter.

2. The apparatus of claim 1, wherein the gating device is configured to output the transition of the input signal to generate an output signal in response to the current count reaching the second value.

3. The apparatus of claim 2, further comprising a circuit configured to set the output of the gating device to the same logic state as the input signal prior to the transition of the input signal.

4. The apparatus of claim 3, wherein the circuit comprises:
   a first inverter including an input configured to receive the input signal;
   a first AND-gate including a first input coupled to an output of the first inverter, a second input coupled to an output of the pulse generator, and an output coupled to a set input of the gating device; and
   a second AND-gate including a first input configured to receive the input signal, a second input coupled to an output of the pulse generator, and an output coupled to a reset input of the gating device.

5. The apparatus of claim 4, wherein the circuit is further configured to set the output of the gating device to a known state in response to a deasserted enable signal.

6. The apparatus of claim 5, wherein the known state is a low logic state, and wherein the circuit further comprises:
   a third AND-gate including a first input configured to receive the enable signal, a second input coupled to an output of the first AND-gate, and an output coupled to the set input of the gating device;
   a second inverter including an input configured to receive the enable signal; and
   an OR-gate including a first input coupled to an output of the second inverter, a second input coupled to an output of the second AND-gate, and an output coupled to the reset input of the gating device.

7. The apparatus of claim 1, wherein the counter is configured to assert a signal in response to the current count reaching the second value, wherein the ring oscillator is configured to cease generating the clock in response to the asserted signal.

8. The apparatus of claim 1, wherein the counter is configured to:
   receive a programming code; and
   set the second value based on the programming code.

9. The apparatus of claim 1, wherein the ring oscillator includes a ring-arranged set of inverters or flip-flops, and wherein outputs of the inverters or flip-flops are initialized with alternating ones and zeros, respectively, in response to a leading edge of the pulse.

10. The apparatus of claim 1, wherein the ring oscillator is configured to generate the clock in response to a trailing edge of the pulse.

11. A method, comprising:
    generating a pulse in response to a transition of an input signal;
    generating a clock in response to the pulse;
    changing a current count from a first value towards a second value in response to periods of the clock; and
    outputting the transition of the input signal to generate an output signal in response to the current count reaching the second value.

12. The method of claim 11, further comprising initializing a ring oscillator configured to generate the clock in response to a leading edge of the pulse.

13. The method of claim 11, wherein generating the clock is in response to a trailing edge of the pulse.

14. The method of claim 11, further comprising:
    asserting a signal in response to the current count reaching the second value; and ceasing the generation of the clock in response to the asserted signal.

15. The method of claim 11, further comprising:
    receiving a programming code; and
    setting the second value based on the programming code.

16. The method of claim 11, further comprising setting an output, where the output signal is generated, to the same logic state as the input signal prior to the transition of the input signal.

17. The method of claim 11, further comprising setting an output, where the output signal is generated, to a known state in response to a deasserted enable signal.

18. An apparatus, comprising:
    means for generating a pulse in response to a transition of an input signal;
    means for generating a clock in response to the pulse;
    means for changing a current count from a first value towards a second value in response to periods of the clock; and means for outputting the transition of the input signal to generate an output signal in response to the current count reaching the second value.

19. The apparatus of claim 18, further comprising initializing the means for generating the clock in response to a leading edge of the pulse.

20. The apparatus of claim 18, wherein the means for generating the clock starts generating the clock is in response to a trailing edge of the pulse.

21. The apparatus of claim 18, further comprising means for asserting a signal in response to the current count reaching the second value, wherein the means for generating the clock is configured to cease generating the clock in response to the asserted signal.

22. The apparatus of claim 18, further comprising:
means for receiving a programming code; and
means for setting the second value based on the programming code.

23. The apparatus of claim 18, further comprising means for setting an output, where the output signal, is generated to the same logic state as the input signal prior to the transition of the input signal.

24. The apparatus of claim 18, further comprising means for setting an output, where the output signal is generated, to a known state in response to a deasserted enable signal.

25. An apparatus, comprising:
a data generating circuit configured to generate data;
a programmable delay line configured to delay the data to generate a delayed data, wherein the programmable delay line comprises:
 a pulse generator configured to generate a pulse in response to a transition of the data;
 an oscillator configured to generate a first clock in response to the pulse;
 a counter configured to change a current count from a first value towards a second value in response to periods of the first clock; and
 a gating device configured to output the transition of the data to generate the delayed data in response to the current count reaching the second value; and
an error detecting circuit configured to generate an error signal in response to the delayed data not logically agreeing with the data when a triggering transition of a second clock occurs.

26. The apparatus of claim 25, further comprising a circuit configured to generate a third clock in response to the error signal, wherein a frequency of the second clock is less than a frequency of the second clock.

* * * * *